US012633847B2

(12) United States Patent　　　　(10) Patent No.:　US 12,633,847 B2
Poh et al.　　　　　　　　　　　　(45) Date of Patent: 　　May 19, 2026

(54) ELECTROSTATIC ADSORPTION TOOL AND OBJECT SURFACE PROCESSING METHOD

(71) Applicant: TSUKUBASEIKO Co., LTD., Tochigi (JP)

(72) Inventors: Fow-Lai Poh, Tochigi (JP); Hiroaki Koyata, Tochigi (JP)

(73) Assignee: Tsukubaseiko Co., Ltd., Tochigi (JP)

( * ) Notice: Subject to any disclaimer, the term of this patent is extended or adjusted under 35 U.S.C. 154(b) by 180 days.

(21) Appl. No.: 18/724,458

(22) PCT Filed: Nov. 10, 2022

(86) PCT No.: PCT/JP2022/041820
　　§ 371 (c)(1),
　　(2) Date: Jun. 26, 2024

(87) PCT Pub. No.: WO2023/132125
　　PCT Pub. Date: Jul. 13, 2023

(65) Prior Publication Data
　　US 2025/0062704 A1　　Feb. 20, 2025

(30) Foreign Application Priority Data
　　Jan. 7, 2022　(JP) ................................. 2022-001771

(51) Int. Cl.
　　*H02N 13/00*　　　(2006.01)
　　*H10P 72/72*　　　(2026.01)
(52) U.S. Cl.
　　CPC ........... *H02N 13/00* (2013.01); *H10P 72/722* (2026.01)

(58) Field of Classification Search
　　CPC ....... H02N 13/00; H10P 72/722; H10P 72/70; H10P 50/00; H10P 72/72; H10P 72/0424
　　　　　　　　(Continued)

(56) References Cited

U.S. PATENT DOCUMENTS

2013/0109189 A1 　5/2013 Cho et al.
2013/0323928 A1* 12/2013 Tanaka ..................... G03F 1/22
　　　　　　　　　　　　　　　　　　　　　　430/5
(Continued)

FOREIGN PATENT DOCUMENTS

CN　　108551713 A　　9/2018
CN　　111213229 A　　5/2020
(Continued)

OTHER PUBLICATIONS

Onishi Hisashi; Title: Electrostatic Chuck; Publication Date: Feb. 7, 1997; Entire specification and figures. (Year: 1997).*
(Continued)

*Primary Examiner* — Dharti H Patel
(74) *Attorney, Agent, or Firm* — Simpson & Simpson, PLLC

(57) ABSTRACT

An electrostatic adsorption tool includes an electrostatic adsorption power generation member in which an electrode element group is embedded. The electrostatic adsorption power generation member electrostatically adsorbs a thin object by applying voltage to the electrode element group. The electrostatic adsorption power generation member includes, at least on an adsorption surface that adsorbs the thin object, a first water repellent insulation layer made of a water repellent material.

6 Claims, 5 Drawing Sheets

(58) Field of Classification Search
USPC ......................................................... 361/234
See application file for complete search history.

(56) References Cited

U.S. PATENT DOCUMENTS

| | | | |
|---|---|---|---|
| 2016/0159052 A1* | 6/2016 | Kim | G02F 1/133308 |
| | | | 361/679.01 |
| 2019/0115241 A1 | 4/2019 | Vellore et al. | |
| 2020/0161156 A1 | 5/2020 | Qiao et al. | |
| 2022/0024208 A1* | 1/2022 | Lee | B41J 2/14201 |
| 2022/0181183 A1* | 6/2022 | Kawase | H01J 37/3244 |
| 2025/0062704 A1* | 2/2025 | Poh | H02N 13/00 |

FOREIGN PATENT DOCUMENTS

| | | |
|---|---|---|
| CN | 114762097 A | 7/2022 |
| JP | H09-036212 A | 2/1997 |
| JP | 2009-141003 A | 6/2009 |
| JP | 2015-512135 A | 4/2015 |
| JP | 2020-537352 A | 12/2020 |
| JP | 2021-089948 A | 6/2021 |
| JP | 2021-141141 A | 9/2021 |
| KR | 10-2020-0056469 A | 9/2018 |
| SG | 11201401970 S | 9/2014 |
| TW | 200935553 A | 8/2009 |
| TW | 201327712 A | 7/2013 |
| TW | 201923951 A | 6/2019 |
| TW | 202025377 A | 7/2020 |
| WO | 2013/067201 A2 | 5/2013 |
| WO | 2019/074661 A1 | 4/2019 |
| WO | 2020/106380 A1 | 5/2020 |
| WO | 2021/111732 A1 | 6/2021 |

OTHER PUBLICATIONS

Taiwanese Office Action mailed on Dec. 9, 2025 for related application No. 111148440.
Korean Office Action mailed on Jan. 29, 2026 for related application No. 10-2024-7023038.

* cited by examiner

A1

30

10

A1

10

30

ELECTROSTATIC ADSORPTION TOOL AND OBJECT SURFACE PROCESSING METHOD

CROSS-REFERENCE TO RELATED APPLICATIONS

This application claims priority based on Patent Application 2022-1771 filed with the Japan Patent Office on Jan. 7, 2022, the entire disclosure of which is fully incorporated by reference herein.

TECHNICAL FIELD

The present disclosure relates to an electrostatic adsorption tool that adsorbs and holds an object and an object surface processing method that processes the object surface in an electrostatically adsorbed state.

BACKGROUND ART

A conventional electrostatic chuck using Coulomb force is known. Such a conventional electrostatic chuck includes a ceramic base, an insulation layer provided on one of the main surfaces of the ceramic base and having an adsorption surface that adsorbs an insulation substrate, and a pair of electrodes provided between the ceramic base and the insulation layer. The insulation layer is a sintered ceramic material identical to the ceramic base. The thickness of the insulation layer is 0.001 mm or more and 0.1 mm or less, and the distance between a pair of electrodes is between 0.3 mm or more and 2.5 mm or less (see, e.g., JP 2021-141141A).

SUMMARY

However, in the prior art described in the above JP 2001-141141A, the adsorption surface that adsorbs a thin object on the electrostatic chuck is composed of an insulation layer (sintered ceramic). Therefore, in a wet (high humidity) environment, the chuck can maintain adsorption for a short period of time, but over a long period of time, the holding power deteriorates, and the chuck cannot maintain adsorption of a thin object.

This invention has been made in response to the above problem and aims to maintain the adsorption of the thin object in a wet environment for a long period of time.

In order to achieve the above mentioned object, the electrostatic adsorption tool is an electrostatic adsorption tool including an electrostatic adsorption power generation member in which an electrode element group is embedded in an electric insulation player. The electrostatic adsorption power generation member electrostatically adsorbs a thin object by applying voltage to the electrode element group. The electrostatic adsorption power generation member includes, at least on an adsorption surface that adsorbs the thin object, a water repellent layer made of a water repellent material.

DESCRIPTION OF EMBODIMENTS

Figure 1:
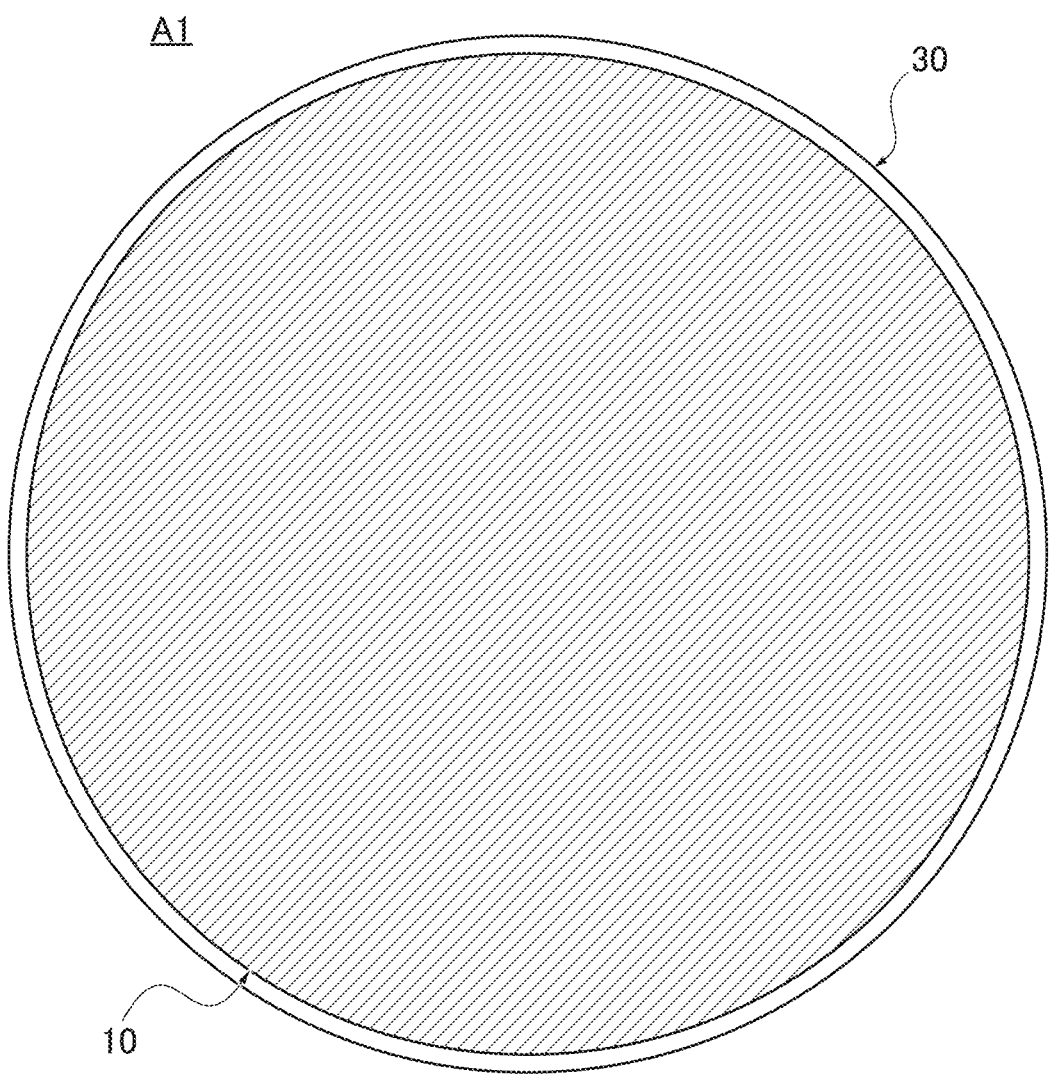
FIG. 1 is a plan view illustrating an electrostatic adsorption tool A1 in First Embodiment.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

Hereinafter, embodiments for implementing an electrostatic adsorption tool and an object surface processing method according to the present disclosure are described based on First and Second Embodiments illustrated in the drawings.

First Embodiment

The electrostatic adsorption tool in First Embodiment uses a wafer that is a material for an IC chip (semiconductor integrated circuit) as a thin object. The object surface processing method is applied to a group of a semiconductor manufacturing equipment that manufactures a single semiconductor chip (die) by applying a circuit pattern such as fine wiring and elements with various surface processing to a surface of an object in an adsorption state. Hereinafter, "Configuration of Electrostatic Adsorption Tool A1" and "Object Surface Processing Method" are described.

Figure 2:
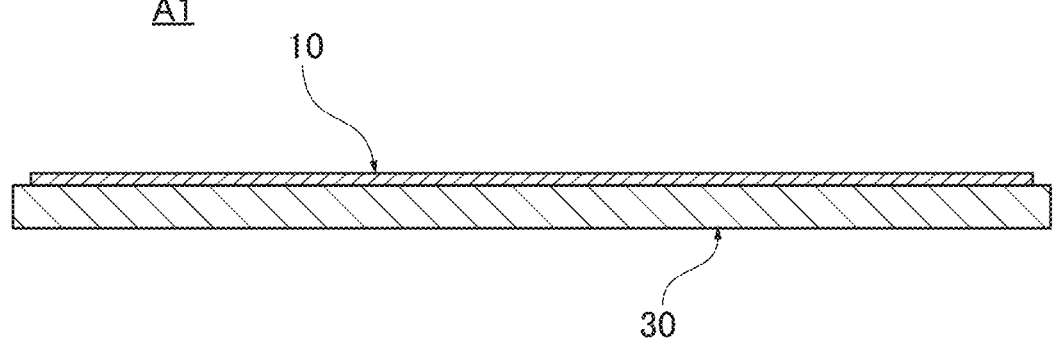
FIG. 2 is a vertical cross-sectional view illustrating the electrostatic adsorption tool A1 in First Embodiment.
Figure 3:
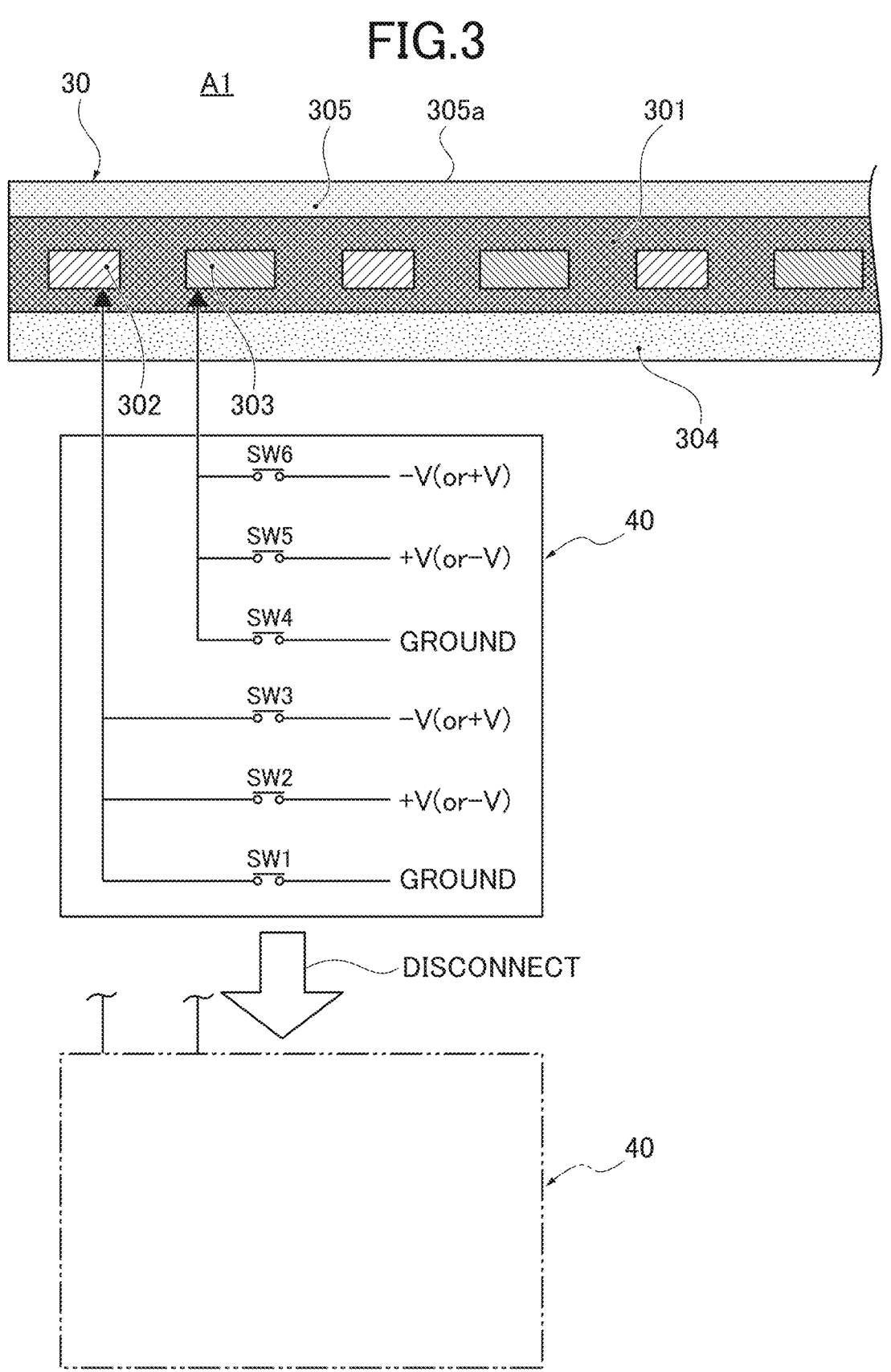
FIG. 3 is a detailed view illustrating an adsorption power controller and an enlarged configuration of the electrostatic adsorption tool A1 in First Embodiment.

A configuration of an electrostatic adsorption tool A1 is described with reference to FIGS. 1 to 4. The electrostatic adsorption tool A1 includes a thin object 10, an electrostatic adsorption power generation member 30, and an adsorption power controller 40, as illustrated in FIGS. 1 to 3.

The thin object 10 is a circular thin plate object with a thickness of 0.5 mm or less, and a typical object is a "wafer" that is a thin circular plate made of a crystal of a semiconductor material. "Wafer" includes a silicon carbide wafer, a sapphire wafer, and a compound semiconductor wafer (for example, gallium phosphide wafer, gallium arsenide wafer, indium phosphide wafer, and gallium nitride wafer) in addition to the most common silicon wafer. Furthermore, "Wafer" also includes a glass wafer used as a support substrate.

The electrostatic adsorption power generation member 30 generates an adsorption power using an electrostatic field and performs an operation for generating an adsorption power to adsorb and hold the thin object 10. As illustrated in FIG. 3, the electrostatic adsorption power generation member 30 includes an electric insulation layer 301, electrode element groups 302, 303, a base plate 304, and a first water repellent insulation layer 305 (water repellent layer).

The electric insulation layer 301 is an electric insulation layer provided on the base plate 304, with the electrode element groups 302, 303 embedded inside. The electrode element groups 302, 303 have alternately arranged positive and negative electrodes.

The first water repellent insulation layer 305 is a layer made of a fluorine material as a water repellent material and provided on the object adsorption side of the electric insulation layer 301. The water repellent insulation layer 305 has an adsorption surface 305a that electrostatically adsorbs the thin object 10. Therefore, the adsorption surface 305a that adsorbs the thin object 10 is a surface with a water repellent layer made of a water repellent material. Here, "water repellent" refers to the property of repelling water on the surface.

As illustrated in FIG. 3, the adsorption power controller 40 can be connected to/disconnected from the electrode element groups 302, 303 in the electrostatic adsorption power generation member 30. The adsorption power controller 40 connects to the electrode element groups 302, 303 to control the generation/extinction of the electrostatic adsorption power, and when the electrostatic adsorption power is generated, even if it is disconnected from the electrode element groups 302, 303, the generation of the electrostatic adsorption power is maintained by the electric charge accumulated in the electrostatic adsorption power generation member 30. That is, the adsorption power controller 40 is not a cord method that is always connected to the electrode element groups 302, 303 by lead wires, etc., but a cordless method that is disconnected from the electrostatic adsorption power generation member 30 when the electric charge is accumulated in the electrostatic adsorption power generation member 30.

In the case of the cordless method, when the thin object 10 is to be adsorbed, the adsorption power controller 40 is connected to the electrostatic adsorption power generation member 30, and the thin object 10 is electrostatically adsorbed by applying voltage to the electrode element groups 302, 303 with the positive electrode 302 and the negative electrode 303. When the generation of the electrostatic adsorption power is confirmed, the adsorption power controller 40 is then disconnected from the electrostatic adsorption power generation member 30 and used to maintain the generation of the electrostatic adsorption power by the electric charge accumulated in the electrostatic adsorption power generation member 30.

As illustrated in FIG. 3, the adsorption power controller 40 includes a first switch SW1 that controls the conduction between the positive electrode 302 and a ground, a second switch SW2 that controls the application of voltage to the positive electrode 302, a third switch SW3 that controls the application of voltage having a polarity opposite to the voltage applied by the second switch SW2, a fourth switch SW4 that controls the conduction between the negative electrode 303 and a ground, a fifth switch SW5 that controls the application of voltage to the negative electrode 303, and a sixth switch SW6 that controls the application of voltage having a polarity opposite to the voltage applied by the fifth switch SW5.

In the initial state of the adsorption power controller 40, all the switches SW1, SW2, SW3, SW4, SW5, and SW6 are turned off. When generating an electrostatic adsorption power, the adsorption power controller 40 is connected to the electrostatic adsorption power generation member 30, and after generating the electrostatic adsorption power by executing the on/off control of each switch, the adsorption power controller 40 is disconnected from the electrostatic adsorption power generation member 30. Even after the disconnection, the generation of the electrostatic adsorption power is maintained for a long period of time. Therefore, when releasing the electrostatic adsorption power, the adsorption power controller 40 is connected to the electrostatic adsorption power generation member 30 again, and the electrostatic adsorption power is released by executing the on/off control of each switch.

Figure 4:
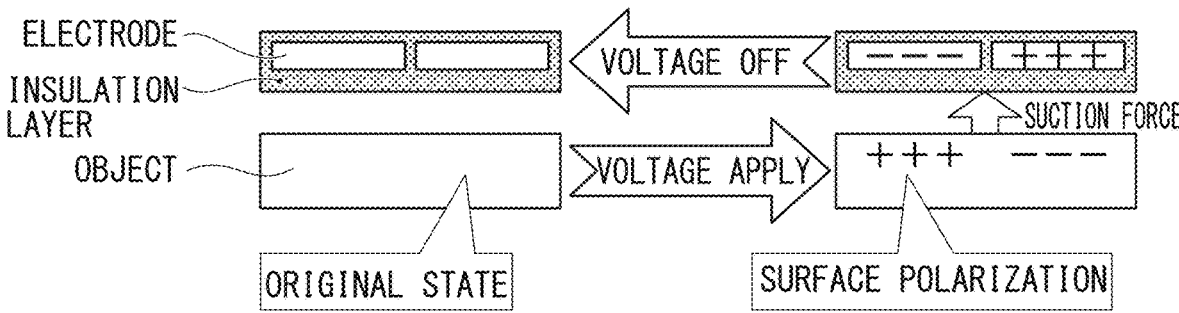
FIG. 4 is an explanation drawing illustrating a principle of generation of an electrostatic adsorption power by an electrostatic chuck.

Next, the principle of the generation of the electrostatic adsorption power at the electrostatic adsorption power generation member 30 is described with reference to FIG. 4. The electrostatic adsorption power generation member 30 used in First Embodiment is an example of an "electrostatic chuck" that electrostatically adsorbs an object by Coulomb force. As illustrated in FIG. 4, the principle of the generation of the electrostatic adsorption power by this "electrostatic chuck" is that surface polarization is induced on the surface of the object when voltage is applied to the electrode. Here, negative surface polarization is induced on the surface of the object facing the electrode to which positive voltage is applied. Positive surface polarization is induced on the surface of the object facing the electrode to which negative voltage is applied. An electrostatic field is formed between the electrode surface and the object surface by arc flow from the positive electrode to the negative electrode over the object surface, and this electrostatic field generates an electrostatic adsorption power that adsorbs the object to the surface of the insulation layer.

When the electrostatic adsorption power is released, as illustrated in FIG. 4, the object returns to the original state (electrostatic chuck and object are separated) by shutting off the application of the voltage to the electrodes, and no electric charge is provided to the object. The reason why no electric charge is provided to the object by shutting off the application of the voltage to the electrodes is that the electrostatic adsorption power is induced by the surface polarization of the object by the applied voltage, and the surface polarization of the object also disappears when the applied voltage to the electrodes is shut off.

Figure 5:
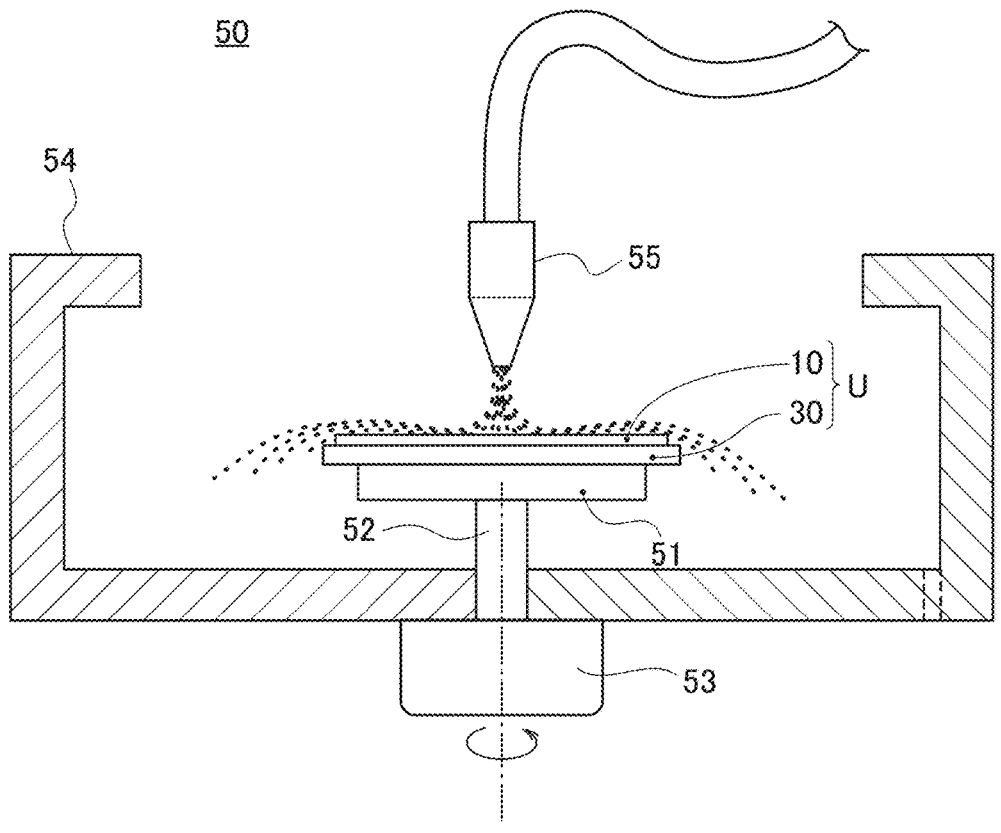
FIG. 5 is an explanation drawing of an object surface processing method illustrating a spin etching processing example that is an example of surface processing using a thin object holding unit U in First Embodiment.

The object surface processing method is described with reference to FIG. 5. As described above, the electrostatic adsorption power generation member 30 is a cordless method that disconnects the adsorption power controller 40 from the electrostatic adsorption power generation member 30. Therefore, an electrostatic adsorption tool A1 can be applied to a surface processing device including a step in a wet (high humidity) environment, in a unit state in which it can be independently transported with the thin object 10 adsorbed. The object surface processing method is performed by applying the surface processing device. Hereinafter, an example of surface processing using the thin object holding unit U is described. An example of etching processing in a spin etching device 50 is described with reference to FIG. 5.

The object surface processing method uses a thin object holding unit U with the thin object 10 electrostatically adsorbed on the electrostatic adsorption power generation member 30. The object surface processing method includes a step of transferring to an inside of the spin etching device 50 (internal transfer step), a step of spin etching processing (spin etching processing step), and a step of transferring to an outside from the spin etching device 50 (external transfer step).

The internal transfer step transfers and sets the thin object holding unit U inside the inside of the spin etching device 50 (example of surface processing device including wet environment step) that realizes circuit generation through corrosion action. Here, the spin etching device 50 refers to a device that corrodes and peels off an unnecessary thin film other than the necessary circuit portion exposed in a preliminary process in semiconductor manufacturing by dripping solvent. As illustrated in FIG. 5, the spin etching device 50, for example, includes a unit receiving base 51, a receiving base spindle 52, a motor 53, a cleaning water receiving container 54, and a cleaning water jet nozzle 55, and the thin object holding unit U is set on the unit receiving base 51.

In the spin etching processing step, circuit generation processing of generating a desired circuit using corrosion action is applied to the set thin object holding unit U. Here, the circuit generation process includes a photomask preparation step, a cleaning step before etching processing, a resist application step, an exposure step, a resist removal step, an etching step, a hardening resist removal step, and a cleaning step after etching processing. The cleaning step before etching processing and the cleaning step after etching processing are the steps in a wet environment using cleaning liquid. In addition to these cleaning steps, steps that are performed using various liquid other than cleaning liquid, such as a resist coating step, a resist removal step, and an etching step are also included in the wet environment step.

When the spin etching processing is completed, the external transfer step removes the thin object holding unit U from the internal process position of the spin etching device 50 while holding the processed thin object 10, and transfers it outside the spin etching device 50.

Here, after transferring the thin object holding unit U outside the spin etching device 50, when the thin object 10 to which film formation processing has been already performed is removed from the thin object holding unit U by separating from the electrostatic adsorption power generation member 30, the adsorption power controller 40 is connected at the external transfer destination, and the electrostatic adsorption power is released. On the other hand, when the film forming processing is a part of a continuous surface processing process, the thin object holding unit U is transferred to the next surface processing device installed outside the spin etching device 50 without changing the thin object holding unit U. When the next surface processing device is the opposite side of the film formation processing surface, the electrostatic adsorption power is released, the front and back sides of the thin object 10 are reversed, and then the electrostatic adsorption power is generated again to electrostatically adsorb the thin object 10, and the film formation processing is performed on the back surface of the thin object 10.

Thus, the object surface processing method aims to perform the surface processing on the thin object 10 that maintains an electrostatic adsorption state even in a wet environment by using the thin object holding unit U including the thin object 10 and the electrostatic adsorption power generation member 30. Therefore, the surface processing device including a wet environment step is not limited to the spin etching device 50 that realizes circuit generation through corrosion action, but also includes a wet etching device, a spin cleaning device having a wet (high humidity) step in a semiconductor device manufacturing step, and a printing and coating device, for example.

The wet etching device uses the corrosive action of chemicals without rotation to peel off an unnecessary thin film except for a necessary circuitry portion, and has the cleaning step before and after the etching process. The spin cleaning device cleans with cleaning liquid while rotating to remove particles (tiny invisible dust), oil, and other contaminants. The printing and coating device generates an insulation film, a metal film, a protective film, etc. by screen printing, and has a cleaning step before and after the printing process. No matter which device it is applied to, the process performance can be improved.

Next, "Background Technique and Problem Solving Measure" is described.

The background technique and problem solving measure are described with reference to FIGS. 6. 7. In recent years, objects requiring a precision process have become thinner and thinner, making it difficult to handle thin objects whose strength has decreased due to thinning. In order to handle the thin objects whose strength has decreased in a step of a precision process without damage, it has become essential to reinforce an adsorption holding tool and other devices. In addition, there is a need to correct the warpage of the thin object having large warpage due to thinning by using an adsorption and holding tool. In the step of the precision process, the applicable adsorption holding tool is significantly limited due to special environments such as wet (high humidity), a high temperature, and a vacuum environment. In order to proceed with the step of the precision process, the thin object must be kept adsorbed for an extended period of time (e.g., two weeks) while being reinforced by the adsorption holding tool.

In the electrostatic adsorption tool, it is possible to maintain adsorption of a thin object for a long time in an atmospheric environment or a vacuum environment. However, in a wet (high humidity) environment, it is possible to maintain adsorption for a short time, but over a long period of time, adsorption cannot be maintained due to progressive decline in holding power.

Figure 6:
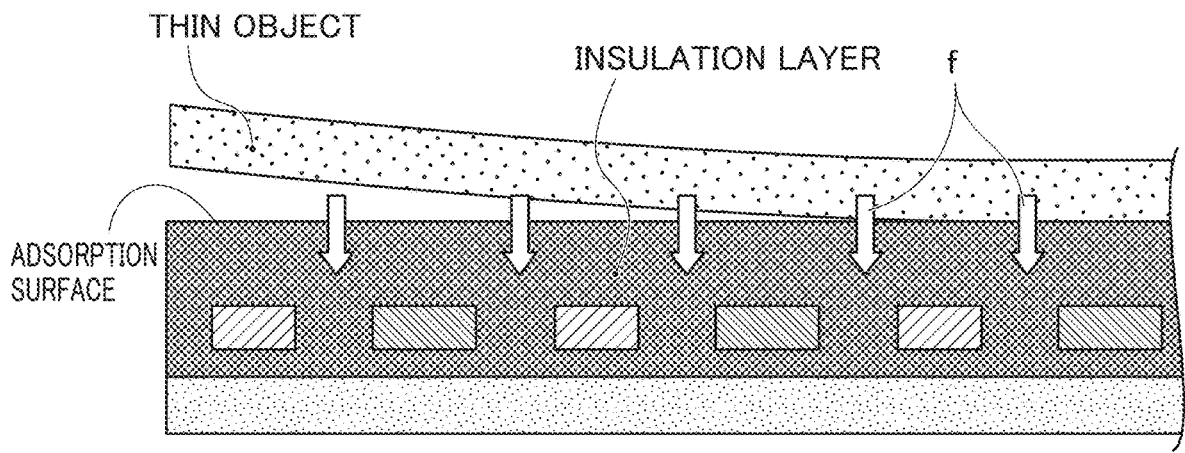
FIG. 6 is an operation explanation drawing illustrating an adsorption operation of a thin object under a moisture adsorption effect of a prior art example.

For example, in the prior art described in the above Patent Literature 1, as illustrated in FIG. 6, the adsorption surface that adsorbs the thin object to the electrostatic chuck includes an insulation layer (sintered ceramic). Therefore, in a wet (high humidity) environment, the adsorption can be maintained for a short time, but after a long time, the holding power f deteriorates and the thin object peels off from the adsorption surface, as illustrated in FIG. 6.

In response to this, the inventor and others proceeded to verify the cause of the progressive decline in holding power in a wet (high humidity) environment. As a result, the inventors discovered through experiments that the electrostatic adsorption tool cannot maintain a normal electric field due to moisture adsorption, resulting in gradual decrease in adsorption power. It was also confirmed that the thin object can be held for a long time by using a water repellent material for the electrostatic adsorption tool to suppress moisture adsorption. It was also confirmed that the use of a fluorine material as a water repellent material reduces contamination due to its antifouling action.

Figure 7:
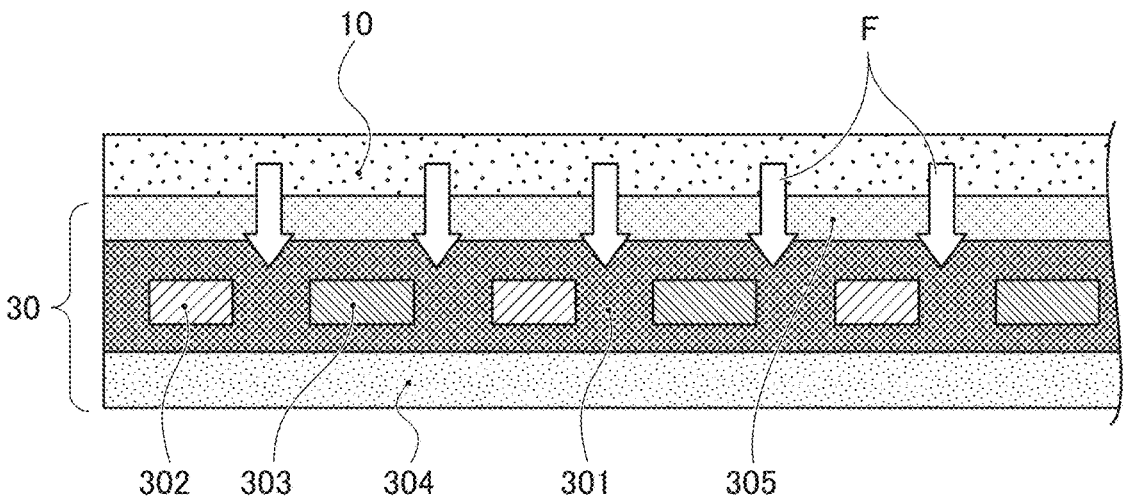
FIG. 7 is an operation explanation drawing illustrating an adsorption operation of a thin object when the moisture adsorption effect is eliminated in First Embodiment.

Therefore, based on the above finding and confirmation, as the configuration of the electrostatic adsorption power generation member 30, the first water repellent insulation layer 305 is provided on the object adsorption side of the electric insulation layer 301, as illustrated in FIG. 7. Accordingly, even in a wet (high humidity) environment, moisture adsorption is suppressed by the first water repellent insulation layer 305, and as illustrated in FIG. 7, the holding power f is maintained even for a long time, and the adsorption of the thin object 10 can be maintained for a long time.

As a result, it is now possible to keep the thin object adsorbed for a long time in a wet (high humidity) environment step, such as a spin etching step, a spin cleaning step, and a coating step, and to improve the processing capacity in each wet (high humidity) step.

As described above, the electrostatic adsorption tool A1 and the object surface processing method of First Embodiment have the following effects.

(1) The electrostatic adsorption tool A1 includes the electrostatic adsorption power generation member 30 in which the electrode element group 302, 303 is embedded in the electric insulation layer 301, the electrostatic adsorption power generation member electrostatically adsorbing the thin object 10 by applying voltage to the electrode element group 302, 303. The electrostatic adsorption power generation member 30 includes, at least on the adsorption surface that adsorbs the thin object 10, the water repellent layer (first water repellent insulation layer 305) made of the water repellent material. Therefore, the adsorption of the thin object can be maintained for a long period of time in a wet environment.

(2) The electrostatic adsorption power generation member 30 includes the base plate 304 and the electric insulation layer 301 in which the electrode element group 302, 303 is embedded. The water repellent layer is the first water repellent insulation layer 305 provided on the object adsorption side of the electric insulation layer 301. Therefore, the electrostatic adsorption tool A1 having the water repellent function in a wet environment by the first water repellent insulation layer 305 can be easily manufactured by the structure that adds an existing electrostatic adsorption tool as a base.

(3) The water repellent layer (first water repellent insulation layer 305) uses the fluorine material as the water repellent material. Therefore, the antifouling effect of the fluorine material reduces the contamination of the thin object 10 to be adsorbed. In addition, the antifouling effect improves the cleanliness of the electrostatic adsorption tool A1. Furthermore, the antifouling effect makes it possible to easily remove the formed film adhered to the electrostatic adsorption tool A1 during the thin film formation process.

(4) The thin object 10 is a thin plate object with a thickness of 0.5 mm or less. Therefore, as the object requiring a precision process become thinner, a wafer such as a silicon wafer that can be held in orderly and tightly by electrostatic adsorption alone using Coulomb power can be included in the thin object 10.

(5) The adsorption power controller 40 that can be connected to/disconnected from the electrode element group 302, 303 of the electrostatic adsorption power generation member 30 is provided. The adsorption power controller 40 is the cordless method that connects to the electrostatic adsorption power generation member 30 when the thin object 10 is adsorbed and disconnects from the electrostatic adsorption power generation member 30 after the thin object 10 is adsorbed. This results in the independent thin object holding unit U including the thin object 10 and the electrostatic adsorption power generation member 30 with the thin object 10 electrostatically adsorbed, allowing for easy transfer and attachment to the surface processing device.

(6) The thin object holding unit U including the electrostatic adsorption power generation member 30 that electrostatically adsorbs the thin object 10 is transferred to the surface processing device (e.g., spin etching device 50) having the wet environment step, and the thin object holding unit U is set in the internal process position of the surface processing device (e.g., spin etching device 50) to perform the surface processing.

When the surface processing is completed, the thin object holding unit U is transferred from the surface processing device (e.g., spin etching device 50) to the outside of the device while holding the surface processed thin object 10. Therefore, the surface processing can be performed while maintaining the adsorption of the thin object 10 in the surface processing device (e.g., spin etching device 50) including the wet environment step by using the independent thin object holding unit U including the thin object 10 and the electrostatic adsorption power generation member 30. In addition, the process performance can be improved by applying to the surface processing device (e.g., spin etching device 50) including the wet environment step.

Second Embodiment

Second Embodiment is an example of an electrostatic adsorption tool A2 including an electrostatic adsorption power generation member having a water repellent layer throughout an entire electric insulation layer.

Figure 8:
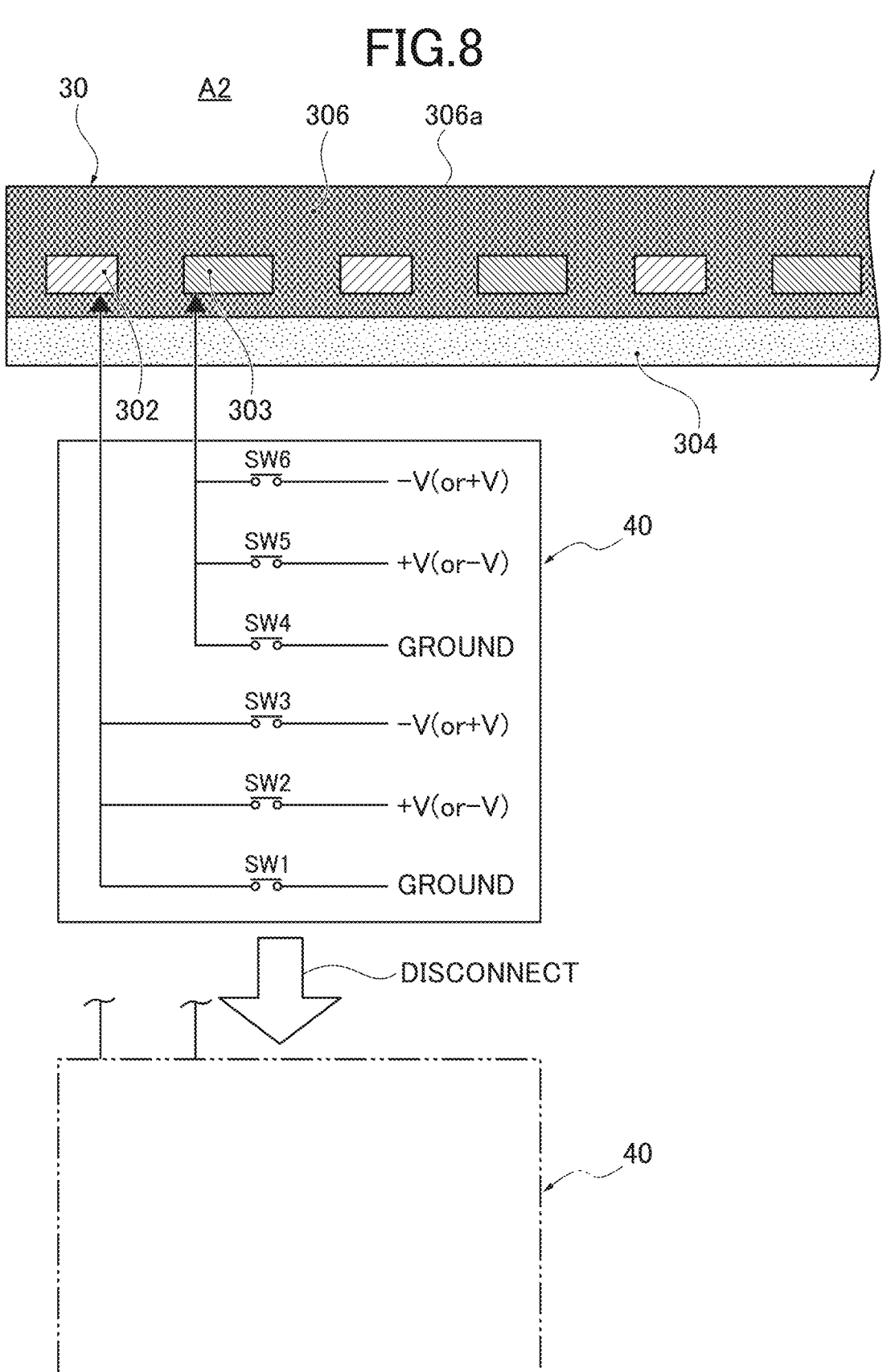
FIG. 8 is a detailed view illustrating an adsorption power controller and an enlarged configuration of an electrostatic adsorption tool A2 in Second Embodiment.

As illustrated in FIG. 8, the electrostatic adsorption power generation member of Second Embodiment includes an electrode element group 302, 303 (positive electrode 302, negative electrode 303), a base plate 304, and a second water repellent insulation layer 306 (water repellent layer).

The second water repellent insulation layer 306 is a layer that is provided on the base plate 304 and serves as both a water repellent layer and an electric insulation layer in which the electrode element groups 302, 303, which are alternately arranged as the positive electrode 302 and the negative electrode 303, are embedded. That is, the second water repellent insulation layer 306 is a layer provided by being replaced with the entire electric insulation layer. The second water repellent insulation layer 306, like the first water repellent insulation layer 305 in First Embodiment, uses a fluorine material as a water repellent material and has an adsorption surface 306a that electrostatically adsorbs the thin object 10. Therefore, the adsorption surface 306a that adsorbs the thin object 10 is a water repellent layer made of a water repellent material.

As other configurations and object surface processing methods in Second Embodiment are the same as those in First Embodiment, the illustrations and explanations are omitted.

As described above, the electrostatic adsorption tool A2 and the object surface processing method of Second Embodiment have the following effects in addition to the effects of (1), (3), (4), (5) and (6) of First Embodiment.

(7) The electrostatic adsorption power generation member 30 includes the base plate 304 and the electric insulation layer in which the electrode element group 302, 303 is embedded. The water repellent layer is the second water repellent insulation layer 306 provided by being replaced with the entire electrical insulating layer. Therefore, the electrostatic adsorption tool A2 having the water repellent function in a wet environment due to the second water repellent insulation layer 306 can be manufactured with a simple structure that omits the electric insulation layer. In addition, the second water repellent insulation layer 306 is expanded to the embedded area of the electrode element group 302, 303, which provides a higher moisture adsorption suppression effect than the first water repellent insulation layer 305.

The electrostatic adsorption tool and the object surface processing method have been described above based on First and Second Embodiments. However, the specific configuration is not limited to these embodiments, and design changes and additions to the configuration are permitted as long as they do not depart from the gist of the invention claimed in each claim.

First and Second Embodiments show an example of using a wafer that is a material for an IC chip (semiconductor integrated circuit) as the thin object 10. However, the thin object is not limited to a wafer. For example, it can also be a film, etc., for which decrease in holding power by the electrostatic adsorption tool is a problem in a process device of a wet environment.

In First Embodiment, an example of the first water repellent insulation layer 305 provided on the object adsorption side of the electric insulation layer 301 is shown as the water repellent layer. In Second Embodiment, an example of the second water repellent insulation layer 306 provided by being replaced with the entire electric insulation layer is shown as the water repellent layer. However, the water repellent layer is not limited to the structures shown in First and Second Embodiments. In short, as long as the structure has a water repellent layer made of a water repellent material on the adsorption surface that adsorbs the thin object, for example, the electrostatic adsorption power generation member may be entirely or partially covered with a water repellent resin film, etc.

The First and Second Embodiments show a preferred example of using the fluorine material as the water repellent material of the water repellent layers (first water repellent insulation layer 305 and second water repellent insulation layer 306). However, the use of the fluorine material as the water repellent material of the water repellent layer is not limited, and a material other than the fluorine material may be used as long as it at least has a water repellent property.

The invention claimed is:

1. An electrostatic adsorption tool comprising:
an electrostatic adsorption power generation member in which an electrode element group is embedded in an electric insulation layer, the electrostatic adsorption power generation member electrostatically adsorbing a thin object by applying voltage to the electrode element group, wherein
the electrostatic adsorption power generation member includes, at least on an adsorption surface that adsorbs the thin object, a water repellent layer having a water repellent material, wherein an adsorption power controller capable of connecting to/disconnecting from the electrode element group of the electrostatic attraction power generation member is provided, and
the adsorption power controller has a cordless method that is connected to the electrostatic adsorption power generation member when the thin object is adsorbed, and is disconnected from the electrostatic adsorption power generating member after the thin object is adsorbed.

2. The electrostatic adsorption tool according to claim 1, wherein
the electrostatic adsorption power generation member includes a base plate and the electric insulation layer in which the electrode element group is embedded, and
the water repellent layer is a first water repellent insulation layer provided on an object adsorption side of the electric insulation layer.

3. The electrostatic adsorption tool according to claim 1, wherein
the water repellent layer uses a fluorine material as a water repellent material.

4. The electrostatic adsorption tool according to claim 1, wherein
the thin object is a thin plate object with a thickness of 0.5 mm or less.

5. The electrostatic adsorption tool according to claim 1, wherein
the electrostatic adsorption power generation member includes a base plate and the electric insulation layer in which the electrode element group is embedded, and
the water repellent layer is a second water repellent insulation layer provided by being replaced with the entire electric insulation layer.

6. A method of processing a surface of an object using an electrostatic adsorption tool described in claim 1, comprising:
transferring a thin object holding unit including the electrostatic adsorption power generation member that electrostatically adsorbs the thin object to a surface processing device having a wet environment step;
performing surface processing by setting the thin object holding unit in an internal process position of the surface processing device; and
transferring the thin object holding unit to outside from the surface processing device while holding the surface processed thin object when the surface processing is completed.

\* \* \* \* \*